United States Patent
Greimel-Rechling et al.

(10) Patent No.: US 8,242,801 B2
(45) Date of Patent: Aug. 14, 2012

(54) SEMICONDUCTOR BODY, CIRCUIT ARRANGEMENT HAVING THE SEMICONDUCTOR BODY AND METHOD

(75) Inventors: Bernhard Greimel-Rechling, Ilz (AT); Peter Trattler, Graz (AT)

(73) Assignee: Austriamicrosystems AG, Unterpremstätten (AT)

( * ) Notice: Subject to any disclaimer, the term of this patent is extended or adjusted under 35 U.S.C. 154(b) by 201 days.

(21) Appl. No.: 12/085,557

(22) PCT Filed: Nov. 16, 2006

(86) PCT No.: PCT/EP2006/011020
§ 371 (c)(1),
(2), (4) Date: Aug. 4, 2009

(87) PCT Pub. No.: WO2007/059893
PCT Pub. Date: May 31, 2007

(65) Prior Publication Data
US 2010/0164538 A1  Jul. 1, 2010

(30) Foreign Application Priority Data
Nov. 23, 2005  (DE) .......................... 10 2005 055 886

(51) Int. Cl.
*H03K 17/16* (2006.01)
(52) U.S. Cl. ....................................................... 326/30
(58) Field of Classification Search .................... 326/30, 326/82–87
See application file for complete search history.

(56) References Cited

U.S. PATENT DOCUMENTS

| | | | |
|---|---|---|---|
| 4,945,267 A | 7/1990 | Galbraith | |
| 5,811,984 A | 9/1998 | Long et al. | |
| 6,516,365 B2 * | 2/2003 | Horowitz et al. | 710/104 |
| 6,541,996 B1 * | 4/2003 | Rosefield et al. | 326/30 |
| 6,642,740 B2 | 11/2003 | Kim et al. | |
| 2004/0174194 A1 | 9/2004 | Chang et al. | |
| 2005/0066077 A1 | 3/2005 | Shibata et al. | |
| 2005/0134305 A1 * | 6/2005 | Stojanovic et al. | 326/31 |

FOREIGN PATENT DOCUMENTS

| | | |
|---|---|---|
| DE | 102 53 695 | 6/2003 |
| EP | 0 706 266 | 4/1996 |
| WO | WO 97/38492 | 10/1997 |
| WO | WO 2004/105246 | 12/2004 |

* cited by examiner

*Primary Examiner* — Shawki S Ismail
*Assistant Examiner* — Thienvu Tran
(74) *Attorney, Agent, or Firm* — Cozen O'Connor

(57) ABSTRACT

An input circuit arrangement comprises an input, a comparator, and an evaluation circuit. The input is designed for coupling to a first terminal of an impedance and for feeding an input signal. The comparator is connected to the input of the input circuit arrangement and is designed for delivering an activation signal to an output as a function of a comparison of the input signal with an adjustable threshold. Furthermore, the evaluation circuit is connected to the input of the input circuit arrangement and for its activation to the output of the comparator and is designed for evaluating the value of the impedance that can be connected.

26 Claims, 8 Drawing Sheets

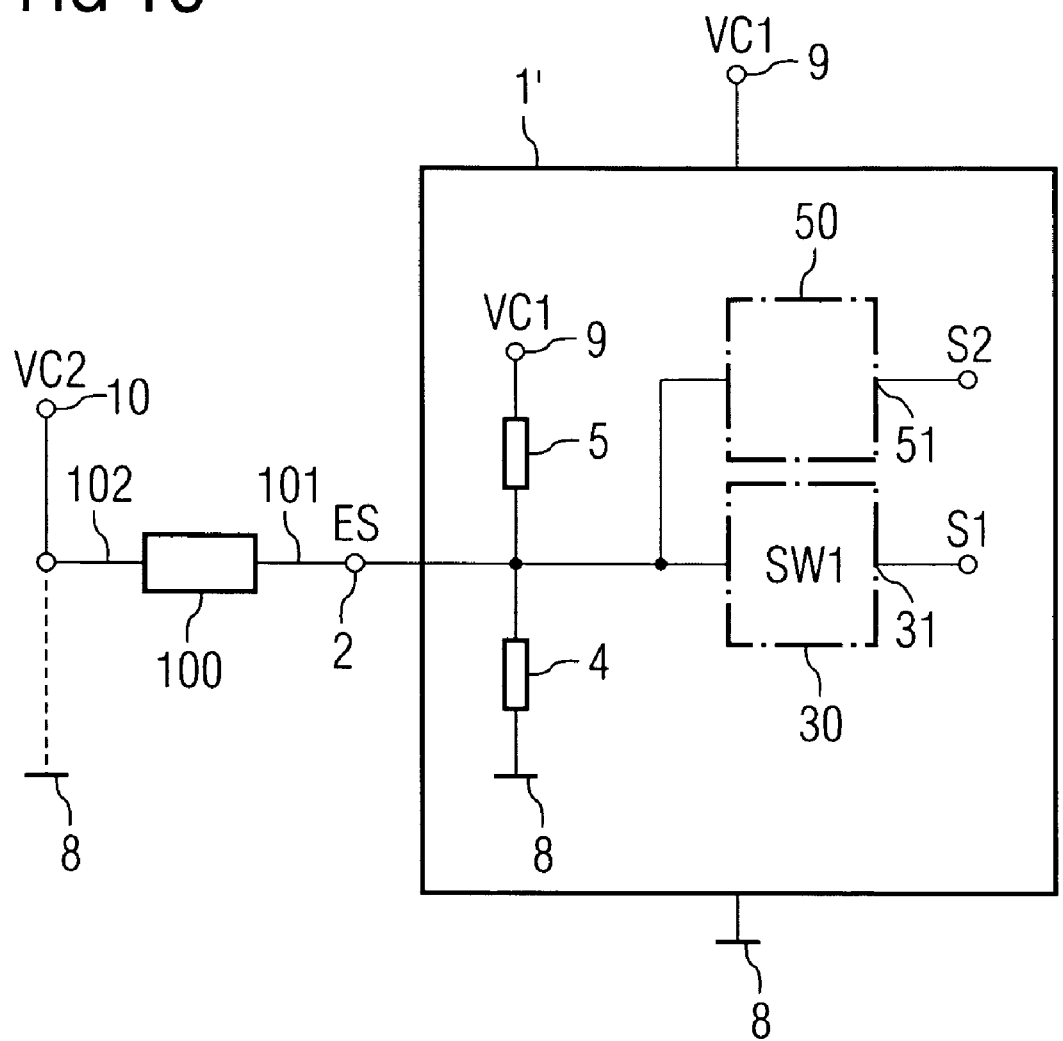

SEMICONDUCTOR BODY, CIRCUIT ARRANGEMENT HAVING THE SEMICONDUCTOR BODY AND METHOD

RELATED APPLICATIONS

This is a U.S. national stage of application No. PCT/EP2006/011020, filed on 16 Nov. 2006.

This patent application claims the priority of German patent application no. 10 2005 055 886.0 filed Nov. 23, 2005, the disclosure content of which is hereby incorporated by reference.

FIELD OF THE INVENTION

The present invention relates to a semiconductor body with an input circuit arrangement, a circuit arrangement with the semiconductor body, a use of the circuit arrangement, and a method for evaluating an input signal.

BACKGROUND OF THE INVENTION

In many cases, semiconductor bodies with circuit arrangements have a first and a second input, with the first input being used for feeding a digitally encoded signal and a resistor, which is connected at its second terminal to a reference potential terminal and whose value is evaluated by the circuit, being connected to the second input. Therefore, such semiconductor bodies have a plurality of inputs, or pins, which results in large surface-area requirements and expense.

SUMMARY OF THE INVENTION

One object of the present invention is to provide a semiconductor body with an input circuit arrangement, a circuit arrangement with the semiconductor body, and also a method for evaluating an input signal, which require low expense and a small number of terminals.

This and other objects are attained in accordance with one aspect of the present invention directed to a semiconductor body that comprises an input circuit arrangement. The input circuit arrangement has an input, a comparator, and an evaluation circuit. The comparator and the evaluation circuit are coupled on the input side to the input of the input circuit arrangement. The comparator has an output. The evaluation circuit is connected on the input side to the output of the comparator.

The input of the input circuit arrangement is designed to be coupled with a first terminal of an impedance that can be connected.

In addition, the input is constructed for feeding an input signal. The comparator is designed for forming an activation signal as a function of a comparison of the input signal with an adjustable threshold and for delivering the activation signal to the output. The evaluation circuit can be activated by means of the activation signal. The evaluation circuit is constructed for evaluating the value of the impedance that can be connected.

According to the proposed principle, an activation of the evaluation circuit and a feeding of an adjustment parameter to the evaluation circuit are advantageously provided by means of a common input. Therefore, the number of inputs of the semiconductor body is reduced. Thus, the semiconductor body advantageously has a small pin number and thus can be manufactured economically.

In one embodiment, the evaluation signal with a non-zero level can be tapped at an output of an activated evaluation circuit and a zero level signal can be tapped for a non-activated evaluation circuit.

In a preferred embodiment, the evaluation circuit can be switched into an on or off operating state as a function of the state of the activation signal. Advantageously, the evaluation device can be turned off by means of the activation signal or it can be set to a rest state, so that as a whole the electrical power consumption of the input circuit arrangement is reduced.

In one improvement, the comparator is designed to deliver a digitally, preferably binary encoded signal as an activation signal.

In one embodiment, the comparator comprises an amplifier, which is connected at one input to the input of the input circuit arrangement and at an output to the output of the comparator. A threshold can be fed to the amplifier at one other input. The amplifier can have a high amplification factor.

In another embodiment, the comparator comprises an inverter, which has a p-channel field-effect transistor and an n-channel field-effect transistor. The p-channel and the n-channel field-effect transistors are connected at their appropriate control terminals to the input of the input circuit arrangement. A terminal of the p-channel field-effect transistor is connected to a first power-supply voltage terminal and another terminal is connected to an output of the inverter. The n-channel field-effect transistor is connected at a first terminal to the output of the inverter and at a second terminal to a reference potential terminal. The output of the inverter is coupled with the output of the comparator. Advantageously, the power draw of the inverter is very low when the input signal is in the vicinity of a first power-supply voltage or a reference potential.

In one embodiment, the p-channel field-effect transistor has at least one geometry parameter and the n-channel field-effect transistor has at least one other geometry parameter. The geometry parameters can comprise the channel width and/or the channel length of the p-channel field-effect transistor and the channel-width and/or the channel length of the n-channel field-effect-transistor. The p-channel field-effect transistor further has a threshold value and the n-channel field-effect transistor has another threshold value. The threshold value of the comparator is advantageously adjustable with the geometry parameters and/or threshold values.

In one embodiment, the evaluation circuit is designed for delivering an analog evaluation signal to the output. In an alternative embodiment, the evaluation circuit is designed for delivering a digitally encoded evaluation signal to the output.

In one improvement, the evaluation circuit comprises a current source, which is designed for delivering a first output current as a function of the value of the impedance that can be connected. The current source is connected on the input side to the input of the input circuit arrangement. In one embodiment, an output of the current source is coupled with the output of the evaluation circuit. A first output current can be tapped at the output of the current source.

In one embodiment of the current source, the current source comprises a first transistor and an amplifier. The first transistor is coupled at a first terminal to the input of the input circuit arrangement and at a second terminal to the output of the current source. The amplifier is coupled at a second input with the input of the input circuit. At one output, the amplifier is coupled with a control terminal of the first transistor. A reference voltage can be fed to the amplifier at a first input.

In one embodiment, the evaluation circuit comprises a converter, which is designed for providing the digitally encoded evaluation signal as a function of a comparison of the first output current or a current derived from this with at least one current switching threshold.

In alternative embodiments of the evaluation circuit, the current source can be replaced in the scope of the proposed principle by other circuits, which have an impedance value as an adjustment parameter.

In one embodiment, a circuit arrangement is provided, which comprises the semiconductor body and the impedance, wherein the impedance is coupled at the first terminal with the input of the input circuit arrangement.

The impedance can comprise a resistor. The resistor can be realized as an ohmic resistor. The impedance can comprise an inductive component. The impedance can have a capacitive component. The value of the impedance can be adjusted by means of a switch.

In a first embodiment, a second terminal of the impedance is coupled with a reference potential terminal.

In a second embodiment, the second terminal of the impedance is coupled with a second power supply voltage terminal for feeding a second power supply voltage.

In a third and preferred embodiment, the circuit arrangement comprises an output circuit arrangement, which is coupled on the output side with the second terminal of the impedance. The output circuit arrangement is realized on another semiconductor body. It is designed for delivering a digitally encoded signal to an output of the output circuit arrangement.

In one embodiment, the output circuit arrangement comprises a universal bus output, or General Purpose Input-Output, abbreviated GPIO.

In a development, the output circuit arrangement comprises an output with three operating states, or Tri-State Output, with the three operating states of high level, low level, and also high impedance.

In one embodiment, the output circuit arrangement is constructed as a digital circuit. In one improvement, the output circuit arrangement comprises a microcontroller.

In one embodiment, the output circuit arrangement comprises a first output transistor. The output transistor is connected at a first terminal to the output of the output circuit arrangement and at a second terminal to the reference potential terminal. One advantage of the embodiment is that this recognizes only the operating states of low level and high impedance and thus is not affected if a third power supply voltage, with which the output circuit arrangement can be energized, is higher or lower than the first power supply voltage.

In an alternative embodiment, the output circuit arrangement comprises the first output transistor and a second output transistor. The second output transistor is coupled at a first terminal with the third power supply voltage terminal for feeding the third power supply voltage and at a second terminal with the output of the output circuit arrangement. Thus, advantageously an embodiment of a tri-state output is realized.

In one improvement, the circuit arrangement comprises at least one other impedance, which is coupled at a first terminal with the input of the input circuit arrangement. In one embodiment of the improvement, the one or more other impedances are coupled at a second terminal with at least one other output of the output circuit arrangement.

In an alternative embodiment of this improvement, at least one other impedance is coupled at the second terminal with at least one terminal of at least one other output circuit arrangement, which is realized on at least one other semiconductor body. Advantageously, the input signal of the input circuit arrangement can be provided through the interaction of at least two output circuit arrangements.

In one embodiment, the impedance is constructed with discrete components. The impedance can comprise a discrete resistor. The impedance can comprise a discrete capacitor. The impedance can have a discrete inductor. The switch can be realized as a push button or key. The switch can be constructed as a relay. The switch can comprise a transistor.

Preferably, the transistor is constructed as a field-effect transistor.

In one embodiment, the semiconductor body with the input circuit arrangement and the one or more other semiconductor bodies with at least one other output circuit arrangement are each understood to mean an integrated circuit.

In one embodiment, the semiconductor body and the one or more other semiconductor bodies of the circuit arrangement are mounted on a carrier. The semiconductor body and the one or more other semiconductor bodies can be housed or alternatively not housed on the carrier using chip-and-board technology.

A bonding wire for connecting the input and/or the output to one of the terminals of the impedance can be provided.

Alternatively, bumps can be provided, with which the input or the output is connected to a metallic surface on the carrier in an electrically conductive way for feeding and carrying off the signals.

In one embodiment, the carrier is a printed circuit board, abbreviated PCB. The printed circuit board can be realized as a flexible printed circuit board.

In one alternative embodiment, the carrier is a ceramic. The impedance can comprise a thin-film resistor or alternatively a thick-film resistor. The impedance can comprise a thin-film capacitor or alternatively a capacitor realized using thick-film technology.

The circuit arrangement can be used to transmit a digital signal and an impedance value to an input of an input circuit arrangement of a semiconductor body.

The circuit arrangement can be used for lighting, such as in a flashlight, a flash, background lighting, and/or key lighting. The circuit arrangement can be used in standard linear circuits, like in a current source for adjusting current, in a voltage regulator, abbreviated LDO, for adjusting voltage, in a DC voltage converter; abbreviated DC/DC converter, for adjusting voltage, or in an audio amplifier for adjusting amplification factor. The circuit arrangement can be used in communications circuits.

In summary, the principle according to the invention has the following advantages:

Two pieces of information, namely a digitally encoded signal and an impedance value, are transmitted to a common input.

The semiconductor body has few inputs and thus a smaller surface area due to the double use of an input of a semiconductor body. The number of connections on the carrier and from the carrier to the semiconductor body is reduced in such a way that the housing is compact and economical. The setup of the entire circuit arrangement is small and economical.

For a given housing size, more functions can be implemented in the design.

The semiconductor body with the input circuit arrangement can be produced in great quantities and thus economically and can be used flexibly for different applications by means of different impedances.

With the double use of an input, complicated interfaces, such as the Inter-IC bus, abbreviated I2C bus, or the Serial Peripheral Interface Bus, abbreviated SPI Bus, can optionally be eliminated for system integration.

BRIEF DESCRIPTION OF THE DRAWINGS

The invention will be explained in more detail below using several embodiments with reference to the figures. Components with identical functions or effects carry identical reference symbols. In so far as circuit parts agree in components and their function, their description will not be repeated for each of the following figures.

FIGS. 1A to 1C each show example circuit arrangements according to the proposed principle.

DETAILED DESCRIPTION OF THE DRAWINGS

Figure 1A:
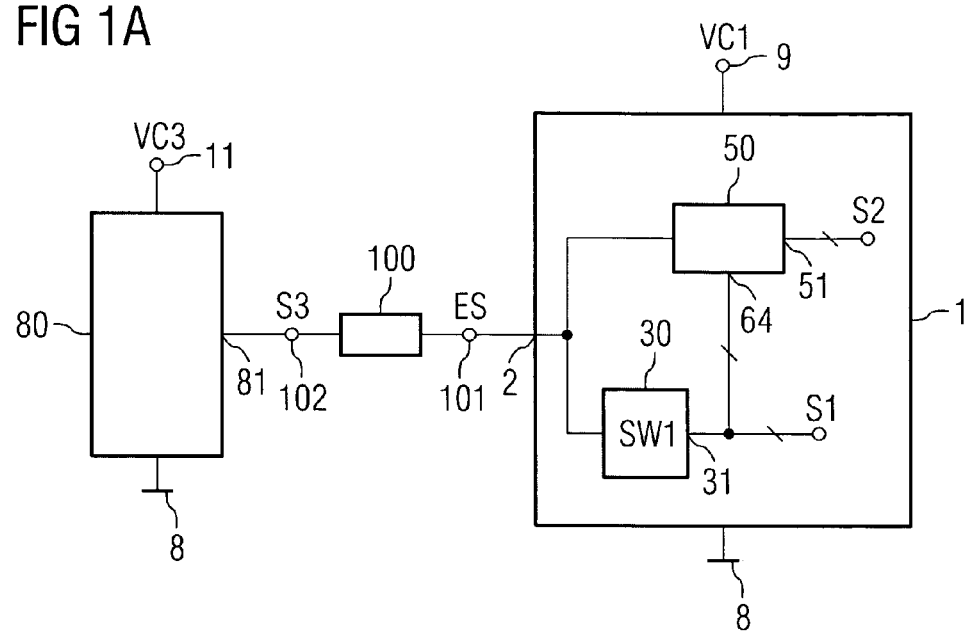

FIG. 1A shows an example circuit arrangement according to the proposed principle, comprising an input circuit arrangement 1, an impedance 100, and an output circuit arrangement 80. The input circuit arrangement 1 has an evaluation circuit 50 and a comparator 30, which are each connected on the input side to an input 2 of the input circuit arrangement 1. The impedance 100 is connected at a first terminal 101 to the input 2 of the input circuit arrangement 1. The impedance 100 is connected at a second terminal 102 to a terminal 81 of the output circuit arrangement 80. The comparator 30 comprises an output 31 for delivering an activation signal S1. The output 31 is connected to an input 64 of the evaluation circuit 50. The evaluation circuit 50 comprises an output 51 for delivering an evaluation signal S2.

The output circuit arrangement 80 delivers an output signal S3 to its terminal 81. Via the impedance 100, the output signal S3 is fed to the input 2 of the input circuit arrangement 1, so that an input signal ES is applied to the input 2. The comparator 30 is designed to deliver the activation signal S1 as a function of a comparison of the input signal ES with an adjustable threshold SW1. The evaluation circuit 50 is constructed for evaluating the value of the impedance 100. When activated, it outputs the evaluation signal S2 as a function of the value of the impedance 100. The input signal ES is a function of the output signal S3, the impedance 100, and an input impedance formed by the input circuit arrangement 1. The input impedance is a function of the evaluation circuit 50 and the comparator 30.

An advantage of the circuit arrangement is that two pieces of information of the input circuit arrangement 1 can be transmitted to the input 2 of the input circuit arrangement 1. In this way, one input is spared.

Figure 1B:
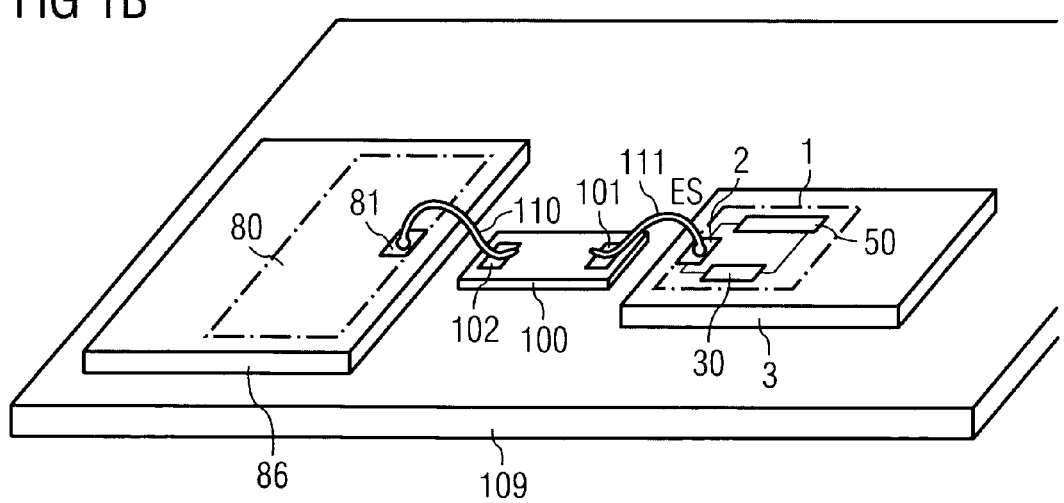

FIG. 1B shows another example embodiment of the circuit arrangement according to FIG. 1A. A semiconductor body 3 comprises the input circuit arrangement 1 with the input 2.

Another semiconductor body 86 comprises the output circuit arrangement 80 with the terminal 81. The semiconductor body 3, the other semiconductor body 86, and the impedance 100 are mounted on a carrier 109. A bonding connection 110 connects the terminal 81 of the output circuit arrangement to the second terminal 102 of the impedance 100. Another bonding connection 111 connects the input 2 of the input circuit arrangement 1 to the first terminal 101 of the impedance 100. The impedance 100 is constructed as a resistor made from a resistive material and first and second terminals 101, 102 that can be bonded. The carrier 109 is a printed circuit board. The circuit arrangement is thus realized using chip-on-board technology.

It is an advantage of the circuit arrangement according to FIG. 1B that by sparing inputs and outputs in the semiconductor bodies 3, 86, the circuit arrangement is compact.

Alternatively, the impedance 100 can be constructed as a surface mount device, abbreviated SMD component.

FIG. 1C shows another example circuit arrangement according to the proposed principle, which is an improvement of the circuit arrangement according to FIG. 1A. The input circuit arrangement 1' has a second resistor 4, which is connected between the input 2 and a reference potential terminal 8. The input circuit arrangement 1' has a third resistor 5, which is connected between the input 2 and a first power supply voltage terminal 9 for supplying power with a first power supply voltage VC1. The impedance 100 is connected at the first terminal 101 with the input 2 of the input circuit arrangement 1' and at the second terminal 102 with a second power supply voltage terminal 10 for connecting to a second power supply voltage VC2.

The second resistor 4 is used for the approximate adjustment of a voltage of the input 2 of the input circuit arrangement 1 to the reference potential in the case of a non-connected input 2 of the input circuit arrangement 1' or the lack of an input signal ES. By means of the third resistor 5, for the lack of the second resistor 4, the voltage of the input 2 of the input circuit arrangement 1' can be adjusted approximately to a voltage of the first power supply voltage VC1. The second and the third resistors 4, 5 are used together for setting the input signal ES to a voltage between the first power supply voltage VC1 and the reference potential, as long as no impedance 100 is connected to the input 2 or no input voltage ES is applied from the outside. The second and the third resistor 4, 5 act as voltage dividers.

The second and/or the third resistors, 4, 5 feature a high resistance value compared with a resistance value of the impedance 100.

A logical level on the second terminal 102 of the impedance 100 is fixed for activating the evaluation unit, because the second terminal 102 of the impedance 100 is energized with the second power supply voltage VC2.

The second and/or the third resistors 4, 5 are alternatively each constructed by a transistor connected as a resistor.

In one alternative embodiment, the second terminal 102 of the impedance 100 is connected to the reference potential terminal 8. If the comparator 30 is constructed so that it provides the activation signal S1 for activating the evaluation circuit 50 for a value of the input signal ES that is smaller than the threshold SW1, then a fixed logical value is advantageously set on the second terminal 102 of the impedance 100 and the evaluation circuit 50 is activated.

Figure 2A:
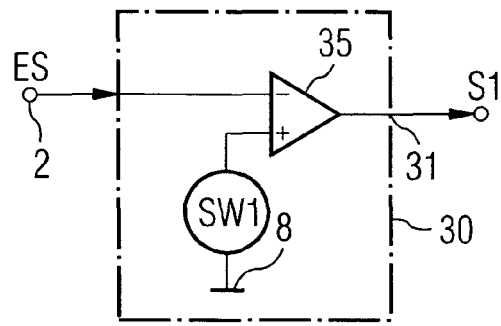
FIGS. 2A to 2C show example embodiments of a comparator.
Figure 2B:
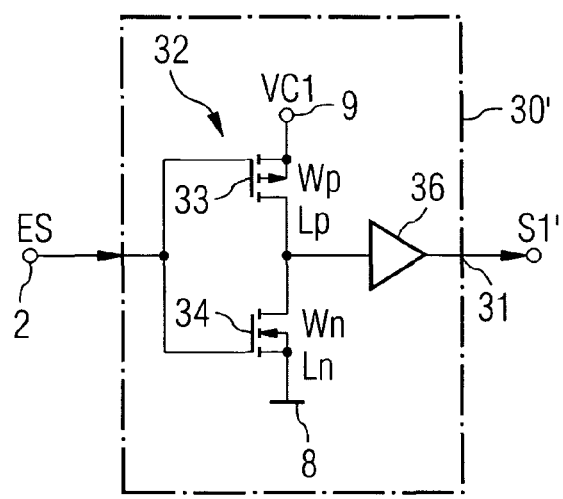
Figure 2C:
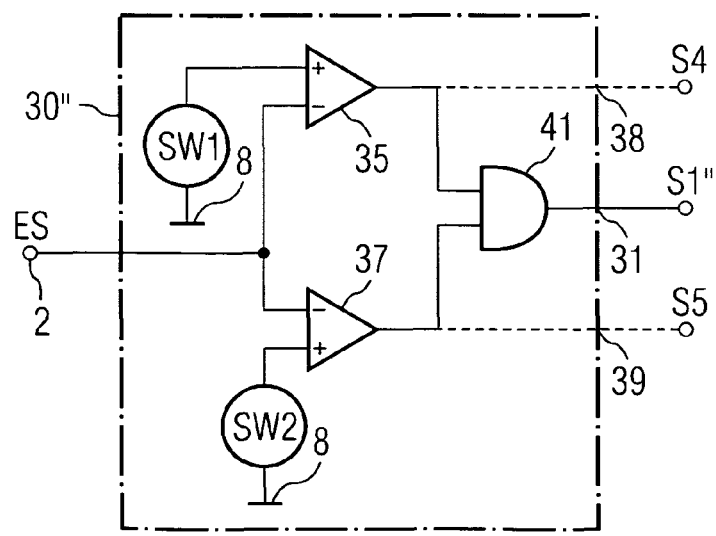

FIGS. 2A to 2C show example embodiments of a comparator 30, 30', 30", as it can be used as comparator 30 in the input circuit arrangements 1 according to FIGS. 1A to 1C, 3A to 3D. The comparator 30 is connected to the input 2 of the input circuit arrangement 1.

FIG. 2A shows the comparator 30 having an amplifier 35 and the output 31 for delivering the activation signal S1. The amplifier 35 is connected at an inverting input to the input 2 of the input circuit arrangement 1 and at one output to the output 31 of the comparator 30.

The amplifier 35 is provided at a non-inverting input with the first threshold SW1. The amplifier 35 forms the activation signal S1 with a high level when the input signal ES lies under the first threshold SW1 and with a low level when the activation signal ES lies above the first threshold SW1.

FIG. 2B shows another example embodiment of the comparator 30, namely a comparator 30'. The comparator 30' has a p-channel field-effect transistor 33 and an n-channel field-effect transistor 34. The two field-effect transistors 33, 34 are connected on the input side to the input 2 of the input circuit arrangement 1. A terminal of the p-channel field-effect transistor 33 is connected to the first power supply voltage terminal 9 for connecting to the first power supply voltage VC1. A terminal of the n-channel field-effect transistor 34 is connected to the reference potential terminal 8. Accordingly, another terminal of the p-channel field-effect transistor 33 and the n-channel field-effect transistor 34 are connected to each other and coupled with the output 31. The coupling is constructed by means of a buffer 36. The p-channel field-effect transistor 33 comprises a channel width WP and a channel length LP. The n-channel field-effect transistor 34 comprises a channel width WN and a channel length LN. The channel widths WP, WN, and channel lengths LP, LN are geometry data of the two field-effect transistors 33, 34.

For a high value of the input signal ES, the n-channel field-effect transistor 34 is switched to a conductive state and the p-channel field-effect transistor 33 is switched to a blocked state, so that the activation signal S1' has a low level. For a low level of the input signal ES, the p-channel field-effect transistor 33 is switched to a conductive state and the n-channel field-effect transistor 34 is switched to a blocked state, in such a way that the activation signal S1' has a high value. The first threshold SW1 of the comparator 30 in FIG. 2B is set by the two channel widths WP, WN, and channel lengths LP and LN, as well as the not-shown threshold voltage of the p-channel field-effect transistor 33 and the not-shown threshold voltage of the n-channel field-effect transistor 34.

Thus, advantageously the activation signal S1 is formed from the input signal ES with very few components.

FIG. 2C shows an example improvement of the comparator 30 according to FIG. 2A, namely a comparator 30". In contrast to the comparator 30 according to FIG. 2A, another amplifier 37 is provided, which is energized at a non-inverting input with the other threshold SW2 and connected at an inverting input to the input 2 of the input circuit 1 and also to the input signal ES. The threshold SW1 and the other threshold SW2 are different. The output of the amplifier 35 and the output of the other amplifier 37 are connected to inputs of an AND gate 41. An output of the AND gate 41 is connected to the output 31 of the comparator 30".

If the other threshold SW2 is smaller than the threshold SW1, then the activation signal S1" with a high level is applied to output 31, when the input signal ES is located between the one and the other threshold SW1, SW2. If the threshold SW1 is smaller than the other threshold SW2, then the activation signal S1" has a high level, when the input signal ES is smaller than the threshold SW1 or greater than the other threshold SW2.

Thus, advantageously a window comparator is formed.

Alternatively, instead of the AND gate 41, an RS flip-flop can be used.

Figure 3A:
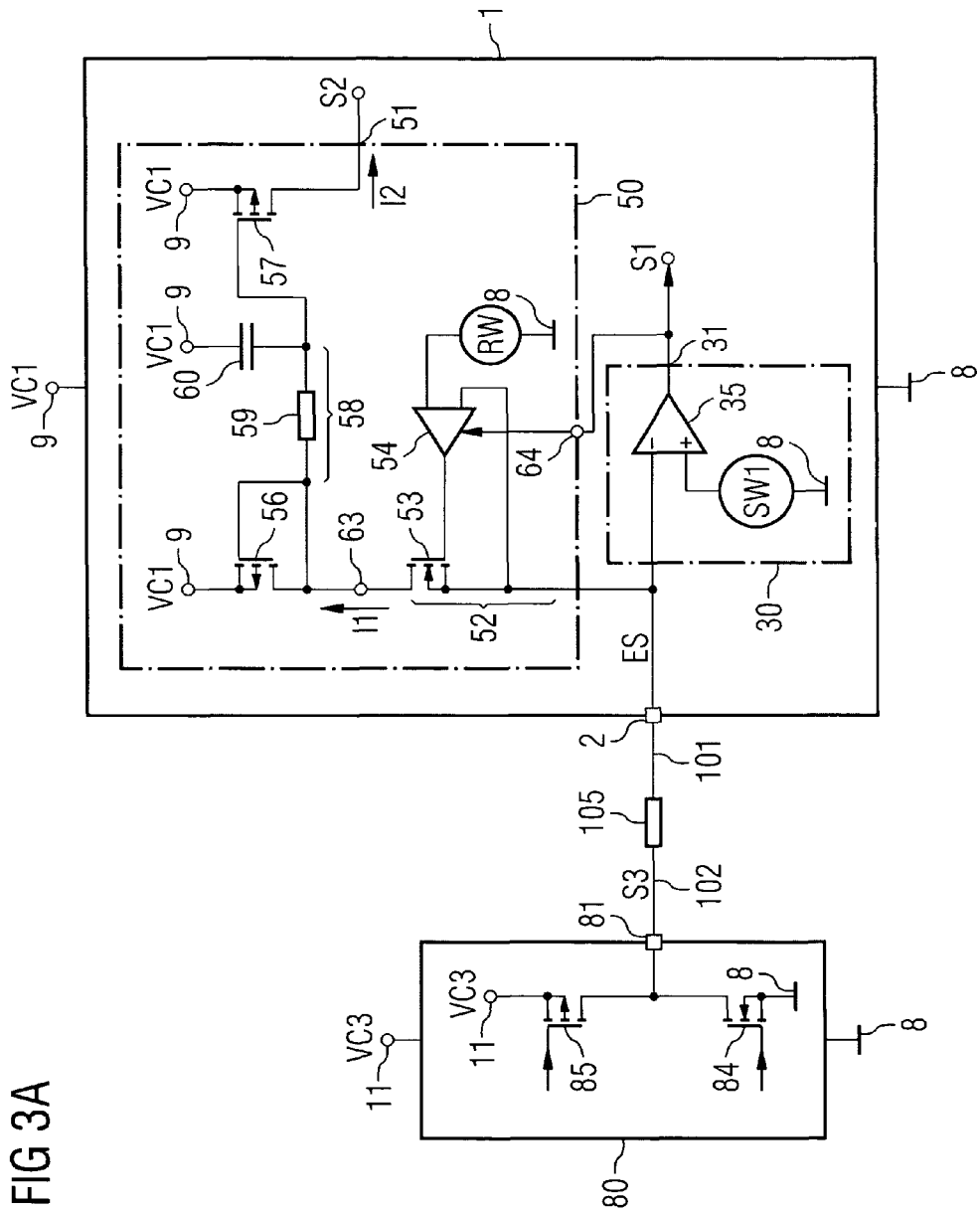
FIGS. 3A to 3D each show example circuit arrangements according to the proposed principle with different evaluation circuits and output circuits.

FIG. 3A shows an example circuit arrangement according to the proposed principle, which is an improvement of the circuit arrangements according to FIGS. 1A to 1C. The circuit arrangement comprises the output circuit arrangement 80, an ohmic resistor 105 as impedance, and the input circuit arrangement 1. The output circuit arrangement 80 has a first and a second output transistor 84, 85. The first output transistor 84 is constructed as an n-channel field-effect transistor and the second output transistor 85 is constructed as a p-channel field-effect transistor. The first output transistor 84 is connected at a first terminal to the reference potential terminal 8 and at another terminal to the output 81 of the output circuit arrangement 80. The second output transistor 85 is connected at one terminal to a third power supply voltage terminal 11 and at another terminal to the output 81. The output 81 of the output circuit arrangement is connected via the ohmic resistor 105 to the input 2 of the input circuit arrangement 1.

The input circuit arrangement 1 has the comparator 30, which is coupled with the input 2 of the input circuit arrangement 1. As a comparator 30, the comparator 30 according to FIG. 2A is provided. The input circuit arrangement 1 has the evaluation circuit 50, which is connected on the input side to the input 2 of the input circuit arrangement 1. The evaluation circuit 50 comprises a current source 52, which is connected after a current mirror 56, 57. The current mirror 56, 57 is connected on the output side to the output 51 of the evaluation circuit 50.

The current source 52 comprises an amplifier 54 and a first transistor 53. The amplifier 54 is energized at one input with a reference value RW and is connected at another input to the input 2. On the output side, the amplifier 54 is connected to a control terminal of the first transistor 53. The first transistor 53 is connected with one terminal also to the input 2 of the input circuit arrangement 1 and with another terminal to the output 63 of the current source 52. The output 63 of the current source 52 is coupled with the current mirror 56, 57. The first transistor 53 is realized as a self-blocking n-channel field-effect transistor.

The output 31 of the comparator 30 is connected via another input 64 of the evaluation circuit 50 to the amplifier 54 for its activation/deactivation.

The current mirror 56, 57 has a second transistor 56, which is connected at one control terminal and one terminal to the output of the current source 52 and at another terminal to the first power supply voltage terminal 9 for feeding the first power supply voltage VC1. The control terminal of the second transistor 56 is connected via a filter 58 to a control terminal of the third transistor 57, which is connected at one terminal to the first power supply voltage terminal 9 for feeding the first power supply voltage VC1 and at another terminal to the output 51 of the evaluation circuit 50.

The filter 58 has a first resistor 59 and a capacitor 60. The first resistor 59 is wired between the control terminal of the second transistor 56 and the control terminal of the third transistor 57. The control terminal of the third transistor 57 is coupled by means of the capacitor 60 with the first power supply voltage terminal 9. Thus, the filter 58 has low-pass filter characteristics. The second and the third transistors 56, 57 are constructed as self-blocking p-channel metal-oxide semiconductor field-effect transistors.

With a high level on the input terminal of the first output transistor 84, the output signal S3 of the output circuit arrangement 80 is pulled to a low level. With a low level on the control terminal of the second output transistor 85, the output signal S3 is pulled to a high level. If the level on the control terminal of the first output transistor 84 is low and the level on the control terminal of the second output transistor 85 is high, then no output signal S3 is formed and the output 81 of the output circuit arrangement 80 is switched to high impedance.

The comparator 30 compares the input signal ES with the threshold SW1 and outputs a high level of the activation signal. S1 if the input signal ES is smaller than the threshold SW1. In this case, by means of the activation signal S1, the amplifier 54 of the current source 52 and thus the entire evaluation circuit 50 is switched to an active state. The current source 52 outputs a first output current I1 on the output side as a function of the value of the resistor 105. The value of the first output current I1 can be calculated approximately with the following equation:

$$I1 = -\frac{RW}{R105},$$

wherein RW is the reference value in the form of a voltage and R105 is a value of the ohmic resistor 105.

It is an advantage of the circuit arrangement that the current source 52 can be activated by means of the output circuit arrangement 80 and can be adjusted by means of the resistor 105 of the current value I1 of the current source 52. Here, advantageously only one input 2 of the semiconductor body 3, in which the input circuit arrangement 1 is located, is needed.

In alternative embodiments, a comparator according to FIG. 2B or 2C can be provided as the comparator 30.

Alternatively, the filter 58 can be bypassed.

Figure 3B:
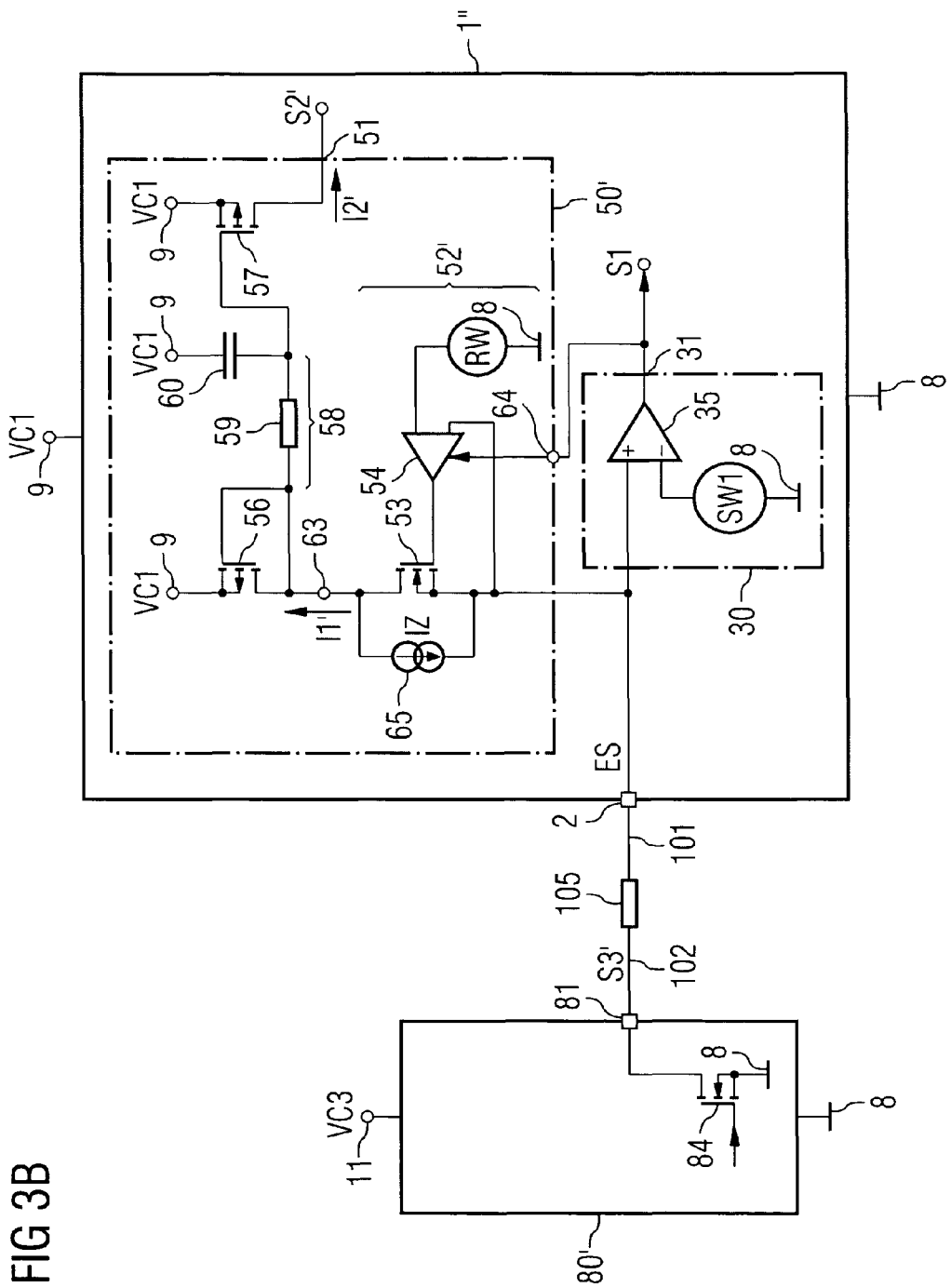

FIG. 3B shows an improvement of the circuit arrangement according to FIG. 3A. In contrast with the circuit arrangement according to FIG. 3A, in the output circuit arrangement 80' according to FIG. 3A, the first output transistor 84 is provided, but the second output transistor 85 is not provided. The current source 52' of the evaluation circuit 50' according to FIG. 3B has, in contrast to the current source 52 according to FIG. 3A, an additional current source 65, which is connected with one terminal to the terminal of the first transistor 53 and with another terminal to the other terminal of the first transistor 53.

If a high level is applied to the control terminal of the first output transistor 84, then the output signal S3' has a low level. If a low level is applied to the control terminal of the first output transistor 84, then no output signal S3' is formed and the terminal 81 is high impedance.

An additional current IZ flows through the other current source 65. As long as the additional current IZ is smaller than the ratio of the reference value RW to the ohmic resistor 105, in the active state, the first output current I1 is approximately equal to the ratio of the reference value RW to the ohmic resistor 105. If the output 81 of the output circuit arrangement 80' is switched to high impedance, then the additional current IZ acts on the inverting input of the amplifier 35 of the comparator 30, so that the activation signal S1 has a low level and thus the amplifier 54 is switched to an inactive state.

It is an advantage of the second current source 65 that for the lack of an output signal S3', the amplifier 54 is switched off and thus the first transistor 53 is switched to a non-conductive state.

In an alternative embodiment, the second output transistor 85 is provided as shown in FIG. 3A. It is not activated, however, but instead it is switched to a blocking state.

Figure 3C:
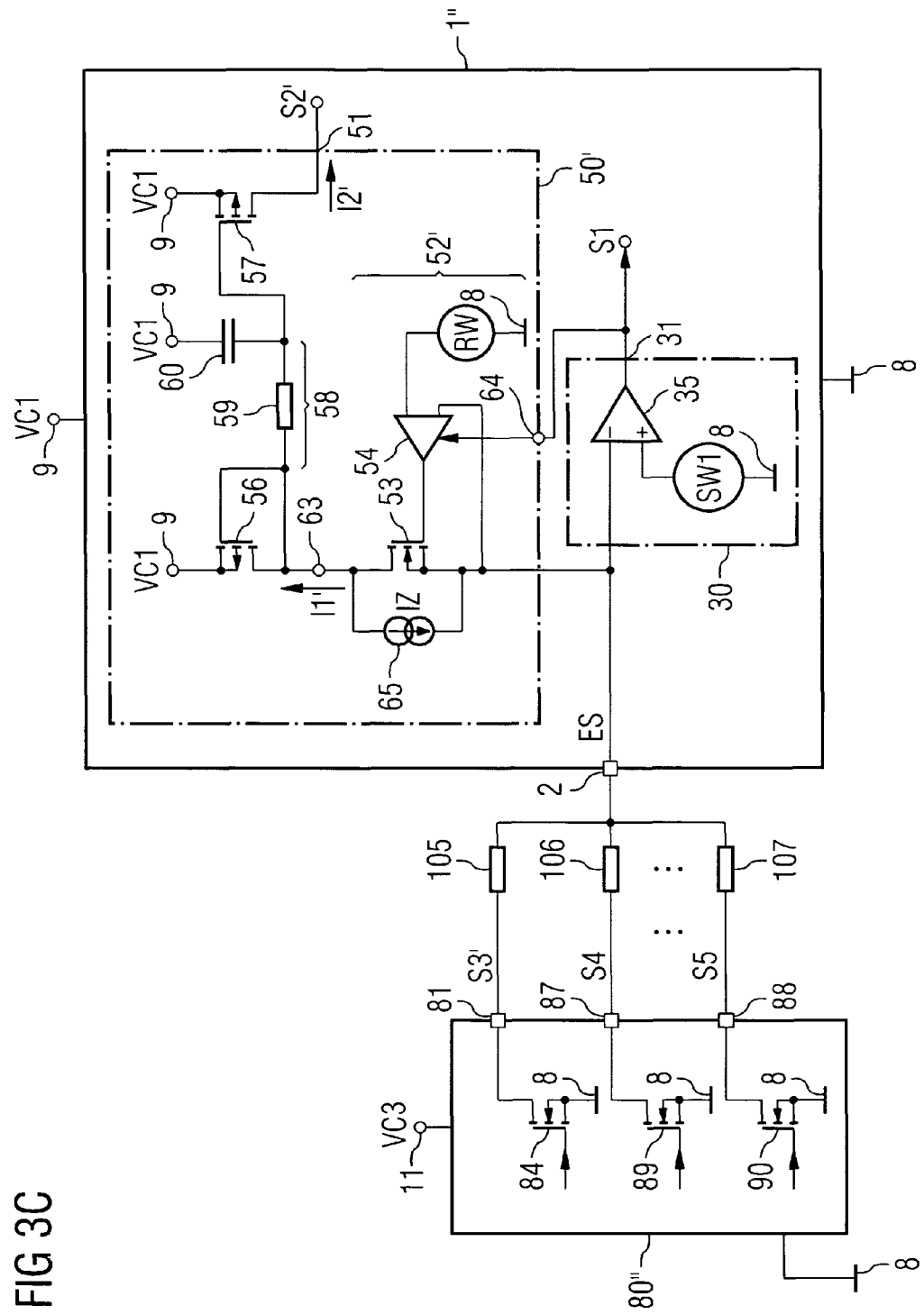

FIG. 3C shows an improvement of the circuit arrangement according to FIG. 3B, in which the output circuit arrangement 80" has a third output transistor 89 and a fourth output transistor 90. The third output transistor 89 is connected at one terminal to the reference potential terminal 8 and at another terminal to another output 87 of the output circuit arrangement 80" for the output of another output signal S4. The fourth output transistor 90 is connected at one terminal to the reference potential terminal 8 and at another terminal to another output 88 of the output circuit arrangement 80" for the output of another output signal S5. The other output 87 is connected via an ohmic resistor 106 to the input 2 of the input circuit arrangement 1". The other output 88 is connected via an ohmic resistor 107 also to the input 2 of the input circuit arrangement 1".

The output signal S3' and the other output signals S4, S5 are adjusted by means of the control signals at the control terminals of the first, third, and fourth output transistors 84, 89, 90. The input signal ES is thus a function of the output signals S3', S4, S5, and the ohmic resistors 105, 106, 107. The first output current I1' is formed as a function of the three output signals S3', S4, S5, and the ohmic resistors 105, 106, 107. If only the output signal S3' is switched to a low level and the other terminals 87, 88 are switched to high impedance, then the first output current I1 is formed only as a function of the ohmic resistor 105. If, for example, the other output signal S4 and the other output signal S5 are at a low level, then the first output current I1 has a value that is formed from the ratio of the reference value RW to the total resistance of the two ohmic resistors 106, 107 connected in parallel. The first output current I1 can be calculated approximately with the following equation:

$$I1 = -RW \cdot \left(\frac{S3'}{R105} + \frac{S4}{R106} + \frac{S5}{R107}\right),$$

wherein RW is the reference value; R105 is the value of the ohmic resistor 105; R106 is a value of the ohmic resistor 106; R107 is a value of the ohmic resistor 107; and also S3', S4, and S5 are output signals, which exhibit logical value 1 for switched-on first, third, or fourth output transistors 84, 89, 90, and otherwise exhibit logical value 0.

Thus, the first output current I1' in the input circuit arrangement 1" can be adjusted advantageously by means of several outputs 81, 87, 88 of the output circuit arrangement 80" and several resistors 105, 106, 107.

In an alternative embodiment, two outputs 81, 87 are provided. In another alternative embodiment, more than three outputs 81, 87, 88 are provided.

Figure 3D:
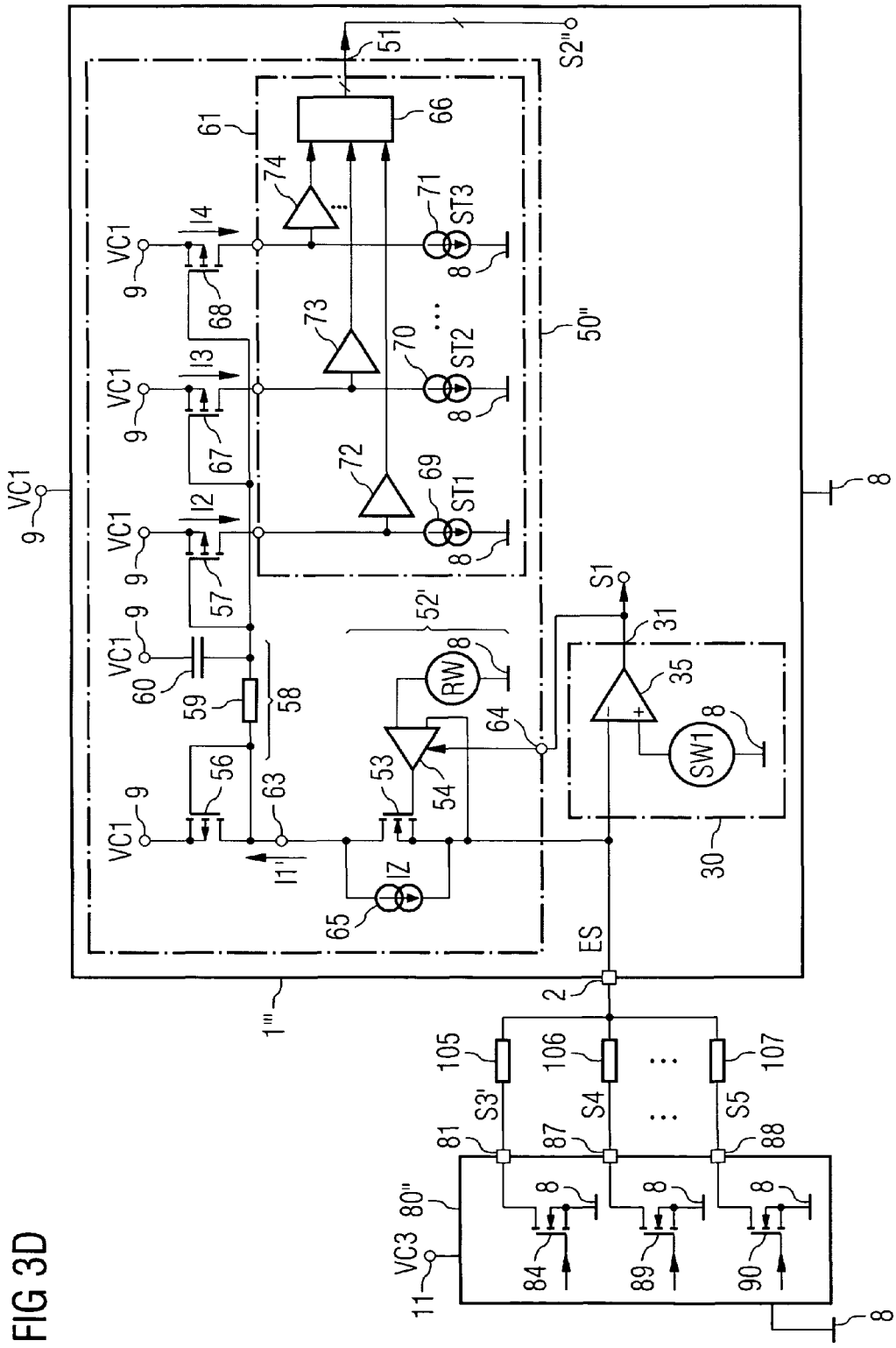

FIG. 3D shows an improvement of the circuit arrangement according to FIG. 3C, in which the current mirror 56, 57 is improved and a converter 61 is connected after the current mirror 56, 57.

The current mirror 56, 57 also comprises a fourth and a fifth transistor 67, 68, which are each connected at a control terminal to a control terminal of the third transistor 57, at a terminal to the first power supply voltage terminal 9 for feeding the first power supply voltage VC1, and at another terminal to an output of the current mirror 56, 57.

The converter 61 comprises an encoding device 66, which is connected on the output side to the output 51 of the evaluation circuit 50" for delivering the evaluation signal S2". The output 51 comprises several lines. The encoding device 66, or encoder, is connected on the input side via a buffer 72 to an input of the converter 61, which is connected to the other terminal of the third transistor 57 and which is connected via a third current source 69 to the reference potential terminal 8. Furthermore, the encoding device 66 is connected on the input side via another buffer 73 to another input of the converter 61, to which the other terminal of the fourth transistor 67 is connected and which is connected via a fourth current source 70 to the reference potential terminal 8. In addition, on the input side the encoding device 66 is connected via another buffer 74 to a third input of the converter 61, at which the other terminal of the fifth transistor 68 is coupled and which is connected via a fifth current source 71 to the reference potential terminal 8.

The third current source 69 is used for adjusting a first current switching threshold ST1, whereas the fourth and fifth current sources 70, 71 are used for adjusting a second and a third current switching threshold ST2, ST3. The converter 61 is used for comparing the current output by the current mirror 56, 57 with the first, second, and third current switching thresholds ST1, ST2, ST3. The encoding device 66 is designed for determining whether the first output current I1 is smaller or greater than the first, second, and/or third current switching threshold ST1, ST2, ST3. It is designed to deliver, at the output 51 including several lines, the evaluation signal S2" in the form of a digitally encoded signal, distributed to several lines or in series.

Thus, advantageously digitally encoded signals, which are applied in the output circuit arrangement 80" to the output transistors 84, 89, 90, are fed via a single input 2 of the input circuit arrangement 1''' and are converted within the input circuit arrangement 1''' back into the digitally encoded evaluation signal S2" distributed on several lines. Thus, advantageously several digitally encoded signals are transmitted via a single input 2 in parallel in such a way that before the input 2, the digitally encoded signals are converted into the input signal ES, which is provided in the form of an analog signal, and after the input 2 the analog signal is converted back into a digitally encoded signal, the evaluation signal S2.

In one alternative embodiment, the converter 61 is provided for comparing with two current switching thresholds ST1, ST2. In another alternative embodiment, the converter 61 is constructed for comparing with more than three current switching thresholds ST1, ST2, ST3.

Figure 4:
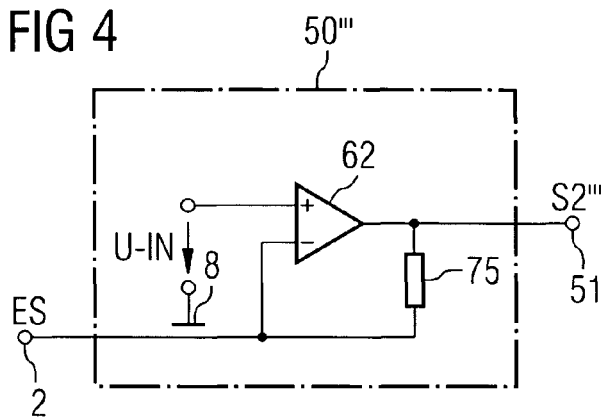
FIG. 4 shows another example evaluation circuit.

FIG. 4 shows an example embodiment of the evaluation circuit 50, which can be used in the input circuit arrangement 1 according to FIGS. 1A and 1C, namely an evaluation circuit 50'''. The evaluation circuit 50''' comprises an amplifier 62 and a fourth resistor 75, which is wired between an output of the amplifier 62 and an inverting input of the amplifier 62. The inverting input of the amplifier 62 is connected to the input 2 of the input circuit arrangement 1. The output of the amplifier 62 is connected to the output 51 of the evaluation circuit 50''' for delivering the evaluation signal S2'''.

The signal U-IN to be amplified is fed to the amplifier 62 at a non-inverting input. The evaluation signal S2''' is formed as a function of the impedance 100 and the fourth resistor 75. If the impedance 100 has a resistor with a resistance value, then the evaluation signal S2''' is approximately proportional to the signal U-IN to be amplified with a proportionality factor formed from the ratio of a resistance value of the fourth resistor 75 divided by the resistance value of the impedance 100 plus one. The evaluation circuit 50''' according to FIG. 4 acts as a non-inverting amplifier.

Thus, through the resistance value of the impedance 100, an amplification factor of the evaluation circuit 50''' can be advantageously adjusted.

FIGS. 5A to 5G show example embodiments of the impedance 100, as they can be used in the circuit arrangements according to FIGS. 1 to 3. Each impedance 100 has the first terminal 101 and the second terminal 102.

Figure 5A:
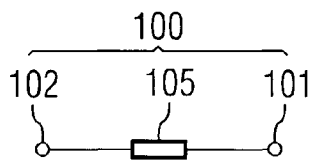
FIGS. 5A to 5G show example embodiments of an impedance.

FIG. 5A shows an ohmic resistor 105 as the impedance 100.

Figure 5B:
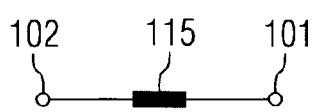
Figure 5C:
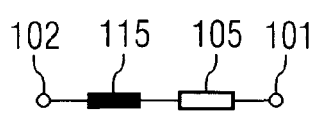
Figure 5D:
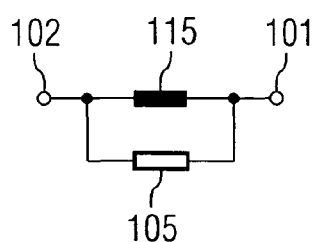

FIG. 5B shows an inductor 115 as the impedance 100. FIG. 5C shows a series circuit made from an inductor 115 and the ohmic resistor 105. FIG. 5D shows a parallel circuit made from the inductor 115 and the ohmic resistor 105. In FIGS. 5B to 5D, the impedance 100 has low-pass filter characteristics. The output signal S3 of the output circuit arrangement 80 is thus made available with a time delay as the input signal ES of the input circuit arrangement 1. In this way, advantageously a delay time can be adjusted.

Figure 5E:
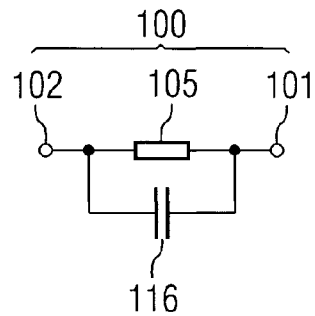
Figure 5F:
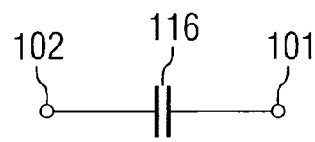

FIG. 5E shows a parallel circuit comprising the ohmic resistor 105 and a capacitor 116. FIG. 5F shows the capacitor 116 as impedance 100. Because the energy content of the capacitor 116 is constant, a change of the output signal S3 is transferred into an equally large change in the input signal ES. For example, if the output signal S3 and the input signal ES are at a high level and if the output signal S3 is changed abruptly from the high level to a low level, then according to FIG. 5E or 5F, the value of the input signal ES is reduced by the same amount. Through a jump of the output signal S3, a pulse of the activation signal S1 is generated by means of the comparator 30.

Figure 5G:
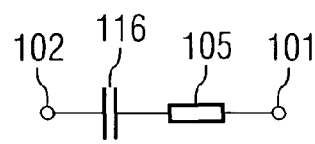

FIG. 5G shows a series circuit including the capacitor 116 and the resistor 105.

The invention claimed is:

1. A circuit arrangement with a semiconductor body with an input circuit arrangement, comprising:
    an impedance connected at a first terminal of the impedance to an input of the input circuit arrangement; and
    the input circuit arrangement comprising:
        the input, which is connected to the first terminal of the impedance, configured to receive an input signal;
        a comparator, which is connected to the input of the input circuit arrangement, configured to deliver an activation signal at an output as a function of a comparison of the input signal with an adjustable threshold; and
        an evaluation circuit, which is connected via a first input to the input of the input circuit arrangement and for evaluation circuit activation to the output of the comparator via a second input of the evaluation circuit and which is configured to evaluate the value of the impedance,
        wherein the evaluation circuit is switched as a function of the activation signal into a switched-on operating state or into a switched-off operating state.

2. The circuit arrangement according to claim 1, wherein the comparator comprises an inverter with
    a p-channel field-effect transistor, which is coupled at a first terminal to a first power supply voltage terminal, at a second terminal to an output of the comparator, and at a control terminal to the input of the input circuit arrangement, and
    an n-channel field-effect transistor, which is coupled at a first terminal to the output of the comparator, at a second terminal to a reference potential terminal, and at a control terminal to the input of the input circuit arrangement,
    and the threshold of the comparator is adjustable by at least one of a geometry parameter of the p-channel field-effect transistor and a geometry parameter of the n-channel field-effect transistor.

3. The circuit arrangement according to claim 1, wherein the comparator is designed for delivering the activation signal as a function of a comparison of the input signal with at least one additional threshold.

4. The circuit arrangement according to claim 1, wherein the evaluation circuit comprises an output for delivering an analog evaluation signal.

5. The circuit arrangement according to claim 1, wherein the evaluation circuit comprises an output for delivering a digitally encoded evaluation signal.

6. The circuit arrangement according to claim 1, wherein the evaluation circuit comprises a current source, which is connected at an input to the input of the input circuit arrangement and which is coupled at an output to the output of the evaluation circuit and which is designed for delivering a first output current to the output of the current source.

7. The circuit arrangement according to claim 6, wherein the current source comprises:
   a first transistor, which is connected at a first terminal to the input of the input circuit arrangement and at a second terminal to the output of the current source; and
   an amplifier, to which, at a first input, a reference voltage is fed, wherein the amplifier is connected at a second input to the input of the input circuit arrangement and is connected at an output to a control terminal of the first transistor.

8. The circuit arrangement according to claim 6, wherein the current source comprises an additional current source, which is coupled at a first terminal to the input of the input circuit arrangement and at a second terminal to the output of the current source.

9. The circuit arrangement according to claim 6, wherein the evaluation circuit comprises a current mirror, which is wired between the current source and the output of the evaluation circuit, the current minor comprising:
   a second transistor, which is connected at a first terminal and at a control terminal to the output of the current source and at a second terminal to a first power supply voltage terminal; and
   a third transistor, which is connected at a control terminal to the control terminal of the second transistor and at a first terminal to the first power supply voltage terminal and which is also coupled at a second terminal to the output of the evaluation circuit for delivering a second output current.

10. The circuit arrangement according to claim 9, wherein the current mirror comprises a filter, which is wired between the control terminal of the second transistor and the control terminal of the third transistor.

11. The circuit arrangement according to claim 9, wherein the evaluation circuit comprises a converter, which is connected before the output of the evaluation circuit and which is designed for delivering the evaluation signal as a function of a comparison of a current tapped at the current mirror with at least one adjustable current switching threshold.

12. The circuit arrangement according to claim 1, wherein the evaluation circuit comprises a non-inverting amplifier arrangement with an amplifier, to which, at a non-inverting input, a signal to be amplified is fed, wherein the amplifier is connected at an inverting input to the input of the input circuit arrangement and via a resistor to an output of the amplifier and is connected at the output of the amplifier to the output of the evaluation circuit for delivering the evaluation signal.

13. The circuit arrangement according to claim 1, wherein the impedance comprises an ohmic resistor.

14. The circuit arrangement according to claim 1, wherein the impedance has an inductive component.

15. The circuit arrangement according to claim 1, wherein the impedance has a capacitive component.

16. The circuit arrangement according to claim 1, wherein the impedance has an adjustable impedance value.

17. The circuit arrangement according to claim 1, wherein a second terminal of the impedance is connected to a reference potential terminal.

18. The circuit arrangement according to claim 1, wherein a second terminal of the impedance is connected to a second power supply voltage terminal.

19. The circuit arrangement according to claim 1, wherein the circuit arrangement comprises another semiconductor body with an output circuit arrangement, which is connected at an output to a second terminal of the impedance and which is constructed for delivering an output signal in the form of a digitally encoded signal.

20. The circuit arrangement according to claim 19, wherein the output circuit arrangement comprises a first output transistor, which is connected at a first terminal to the output of the output circuit arrangement and at a second terminal to the reference potential terminal and which comprises a control terminal.

21. The circuit arrangement according to claim 20, wherein the output circuit arrangement comprises a second output transistor, which is connected at a first terminal to a third power supply voltage terminal and at a second terminal to the output of the output circuit arrangement and which comprises a control terminal.

22. The circuit arrangement according to claim 19, wherein the circuit arrangement comprises at least one other ohmic resistor, which is connected at a first terminal to the input of the input circuit arrangement and at a second terminal to at least one other terminal of the output circuit arrangement, and the impedance comprises the ohmic resistor.

23. A method of an input circuit arrangement according to claim 1, for evaluating a digital signal, which is fed to the input of the input circuit arrangement, and an impedance value of the impedance that is coupled to the input of the input circuit arrangement.

24. A method for evaluating an input signal at an input of an input circuit arrangement of a semiconductor body, comprising the steps of:
   tapping the input signal at the input of the input circuit arrangement, wherein an impedance is connected to the input of the input circuit arrangement;
   comparing, by a comparator, the input signal with an adjustable threshold and delivering an activation signal as a function of a comparison result by the comparator;
   preparing an evaluation signal by an evaluation circuit as a function of an impedance value of the impedance, wherein the impedance value is tapped at the input; and
   executing the step of preparing the evaluation signal as a function of a state of the activation signal,
   wherein the evaluation circuit is connected via a first input to the input of the input circuit arrangement, and the evaluation circuit is connected for activation to an output of the comparator via a second input of the evaluation circuit, and
   wherein the evaluation circuit is switched as a function of the activation signal into a switched-on operating state or into a switched-off operating state.

25. A semiconductor body with an input circuit arrangement, the input circuit arrangement comprising:
   an input designed for coupling to a first terminal of an impedance and for feeding an input signal;
   a comparator, which is connected to the input of the input circuit arrangement and which is designed for delivering at an output of the comparator an activation signal as a function of a comparison of the input signal with an adjustable threshold; and
   an evaluation circuit which is connected to the input of the input circuit arrangement and for evaluation circuit activation to the output of the comparator and which is configured to evaluate the value of the impedance,
   wherein the evaluation circuit comprises a current source which is connected at an input to the input of the input circuit arrangement and is coupled at an output to the output of the evaluation circuit for delivering a first output current to the output of the current source.

26. A circuit arrangement with a semiconductor body with an input circuit arrangement, comprising:

an impedance connected at a first terminal of the impedance to an input of the input circuit arrangement; and the input circuit arrangement comprising:

the input, which is connected to the first terminal of the impedance, configured to receive an input signal;

a comparator, which is connected to the input of the input circuit arrangement, configured to deliver an activation signal at an output as a function of a comparison of the input signal with an adjustable threshold; and an evaluation circuit, which is connected via a first input to the input of the input circuit arrangement and for evaluation circuit activation to the output of the comparator via a second input of the evaluation circuit and which is configured to evaluate the value of the impedance, wherein the comparator comprises an inverter with a p-channel field-effect transistor, which is coupled at a first terminal to a first power supply voltage terminal, at a second terminal to an output of the comparator, and at a control terminal to the input of the input circuit arrangement, and an n-channel field-effect transistor, which is coupled at a first terminal to the output of the comparator, at a second terminal to a reference potential terminal, and at a control terminal to the input of the input circuit arrangement, and the threshold of the comparator is adjustable by at least one of a geometry parameter of the p-channel field-effect transistor and a geometry parameter of the n-channel field-effect transistor.

\* \* \* \* \*